US006594292B2

(12) United States Patent
Kawasuji et al.

(10) Patent No.: US 6,594,292 B2
(45) Date of Patent: Jul. 15, 2003

(54) SATURABLE REACTOR AND POWER SOURCE APPARATUS FOR PULSE LASER UTILIZING SAME

(75) Inventors: Yasufumi Kawasuji, Hiratsuka (JP); Masao Hagiwara, Hiratsuka (JP); Yasuhiko Matsuki, Hiratsuka (JP); Yoshio Nomura, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/352,610

(22) Filed: Jul. 13, 1999

(65) Prior Publication Data

US 2002/0176460 A1 Nov. 28, 2002

(30) Foreign Application Priority Data

Jul. 14, 1998 (JP) .......................................... 10-199249

(51) Int. Cl.[7] .............................. H01S 3/00; H03K 3/00

(52) U.S. Cl. ................................ 372/38.02; 372/38.01; 372/38.03; 372/38.04; 372/38.07; 372/38.1; 372/37; 307/419; 307/415; 307/106

(58) Field of Search ............................ 372/38.1, 38.02, 372/38.03, 38.04, 38.01, 38.07, 37; 307/419, 414, 415, 106–108; 335/227

(56) References Cited

U.S. PATENT DOCUMENTS 3,617,809 A * 11/1971 Penn et al. .................... 361/45
3,728,580 A * 4/1973 Marot .......................... 361/45
3,739,257 A * 6/1973 Hunter ........................ 323/248
4,257,088 A * 3/1981 Nilssen ........................ 363/18
4,612,455 A * 9/1986 Weiner et al. .............. 307/419
4,694,387 A * 9/1987 Walker ........................ 363/56
4,818,892 A * 4/1989 Oohashi et al. ............. 307/106
4,907,246 A * 3/1990 Kleiner ....................... 323/335
5,138,627 A * 8/1992 Friede et al. ................. 372/86
5,177,754 A * 1/1993 Ball et al. ................ 372/38.02
5,770,982 A * 6/1998 Moore ......................... 333/32

FOREIGN PATENT DOCUMENTS

JP 62076511 A * 4/1987 ................. 307/104
JP 62108588 A * 5/1987 .................. 372/90
JP 402105479 A * 4/1990 .................. 372/30

* cited by examiner

*Primary Examiner*—Paul Ip
*Assistant Examiner*—James Menefee
(74) *Attorney, Agent, or Firm*—Varndell & Varndell, PLLC

(57) ABSTRACT

A saturable reactor is in a conductive state or has a magnetic switching function depending on the direction of the current flowing through it. Also provided is a power source apparatus for pulse laser utilizing the satiable reactor. The saturable reactor comprises a saturable magnetic core (1); a principal coil (2) wound around the saturable magnetic core (1); a subsidiary coil (3) wound around the saturable magnetic core (1); and a power source (4) which feeds electric current (ib) to the subsidiary coil (3) when the transition of the saturable magnetic core (1) from unsaturated state to saturated state is effected by the subsidiary coil (3) wherein the saturable magnetic core (1) becomes saturated state immediately when a current (i2) is applied to the principal coil (2) in a direction same as the current flowing in the subsidiary magnetic coil (3), while becoming the saturated state from an initial unsaturated state at the time when a product of the voltage and time reaches a predetermined value if a current (i1) is applied to the principal coil (2) in a direction opposite to the current flowing in the subsidiary magnetic coil (3).

16 Claims, 3 Drawing Sheets

SATURABLE REACTOR AND POWER SOURCE APPARATUS FOR PULSE LASER UTILIZING SAME

BACKGROUND OF THE INVENTION

1. Field of the Invention

The present invention relates to a saturable reactor having a magnetic switching function which serves to switch between a high inductance state and a low inductance state and a low-inductance conductive function in accordance with the direction of the current flowing therethrough so as to perform high-speed, large-power rectification. It further relates to a power source apparatus for pulse laser utilising the saturable reactor.

2. Description of the Related Art

Saturable reactors comprising a magnetic core of ferrite or amorphous magnetic material have conventionally been used as magnetic switches by utilising the non-linear permeability of the magnetic material. The configuration of these saturable reactors is such that a principal coil is wound a prescribed number of times around the magnetic core. When the electric current I flowing through the principal coil increases, so does the magnetic flux density B as illustrated in FIG. 5. Once the magnetic flux density B reaches B0, the magnetic core becomes a state of saturation in which the constant magnetic flux density B0 is maintained despite a further increase in the electric current. In this state of saturation, the inductance of the magnetic core is very small. As a result, the saturable reactor fulfils the function of a magnetic switch. Even if the electric current flows through the principal coil in the opposite direction, it still fulfils the same magnetic switching function. The absolute value of the electric current at which the transition from unsaturated to saturated state occurs is the same, as is the magnetic flux density, and the B–H characteristics are in point symmetry with respect to the origin.

Japanese Patent Publication 62-76511 proposes an improved saturable reactor in which a supplementary coil is wound around a saturable iron core in addition to a principal coil. By feeding a bias current to the supplementary coil in accordance with the current in the principal coil, a magnetic switch is provided which performs controllable switching action for the electric current flowing through the principal coil. With this satiable reactor, by altering the amount of current in the supplementary coil, it is possible to switch with the desired timing without regard to the amount of current flowing through the principal coil.

However, conventional saturable reactors with a supplementary coil such as the magnetic switch described in Japanese Patent Publication 62-76511 has the supplementary coil for the purpose of resetting the magnetism.

For instance, in the power source apparatus for pulse laser illustrated in FIG. 6, electric charge is stored directly into a capacitor C11 by a charger 11 which forms a power source for charging. The electric charge stored in this capacitor C11 begins transferring energy when a switch SW1 turns on. More particularly, as the switch SW1 turns on, the voltage generated across a saturable reactor SL11 increases, and after a predetermined assist time at that voltage, that is, after a product of time and voltage reaches a predetermined value, the saturable reactor SL11 reaches saturation, turning the saturable reactor SL11 on. The electric charge stored in the capacitor C11 is transferred in the form of the current I11 by way of the saturable reactor SL11 and the switch SW1 to the opposite side of the capacitor C11. Thereafter, voltage is generated across the saturable reactor SL12, turning it on when the saturable reactor SL12 reaches saturation after a predetermined assist time at that voltage. The electric charge stored in the capacitor C11 is transferred in the form of the current I12 to a peaking capacitor CP1. The electric charge which has been transferred to the peaking capacitor CP1 becomes the electric current I13, which causes the laser discharge unit LD1 to discharge, creating laser pulse oscillation.

However, in the power source apparatus for pulse laser illustrated in FIG. 6, when the switch SW1 turns on and the electric charge which has been charged in the capacitor C11 is transferred, this causes the voltage P0 across the capacitor C11, which has been positive during charging, to reverse polarity and rapidly change into negative. From the point at which the voltage P0 becomes negative, the electric current I01 is output from the charger 11. As a result, it sometimes happens that the charging current flowing out from the charger 11 increases beyond its design value, leading to problems of damage to the charger 11 and inferior accuracy of charging.

Meanwhile, in the power source apparatus for pulse laser illustrated in FIG. 7, a charger 12 charges at least a capacitor C12 by way of a saturable reactor SL21. When a switch SW2 turns on, voltage is generated across the saturable reactor SL21. When the saturable reactor SL21 turns on after a product of time and voltage reaches a predetermined value, electric charge stored in the capacitor C12 in the form of current 121 is subjected to a reversal of polarity whereby it is transferred to the opposite side of the capacitor C12. Thereafter, voltage is generated across a saturable reactor SL22, turning it on after a predetermined assist time at that voltage. The electric charge transferred to the, capacitor C12 in the form of current 122 is transferred to the peaking capacitor CP2. The electric charge which has been transferred to a peaking capacitor CP2 becomes electric current 123, which causes a laser discharge unit LD2 to discharge, creating laser pulse oscillation.

However, if there are ripples in the electric current flowing from the charger 12 in the power source apparatus for pulse laser illustrated in FIG. 7, when the charger 12 charges the capacitor C12 by way of the saturable reactor SL21, the frequency of these ripples causes the inductance of the saturable reactor SL21 to increase, inhibiting the charging of the capacitor C12, with the result that a surge voltage is generated at point P1 on the charger 12 side of the saturable reactor SL21. This surge voltage is problematic in that it may exceed the withstand voltage of the switch SW2 and cause it to break, while it also makes it impossible to detect the voltage across the capacitor C11 with accuracy.

In such a case, if the saturable reactor SL21 is conductive in the direction of the charging current and has the magnetic switching function for the magnetic compression action of the charged electric charge, the switch SW2 can be protected because surge voltage is not generated, and also the electric current with ripples can be utilised as the charging current.

SUMMARY OF THE INVENTION

It is an object of the present invention to eliminate such problems as described above, and to provide a saturable reactor having a conductive state and a magnetic switching function corresponding to the direction of the electric current, and a power source apparatus for pulse laser utilising the satiable reactor.

The first aspect of the present invention is a saturable reactor comprising a saturable magnetic core; a principal coil wound around the saturable magnetic core; a subsidiary coil wound around the saturable magnetic core; and a power source which feeds electric current to the subsidiary coil when the transition of the saturable magnetic core from unsaturated state to saturated state is effected by the subsidiary coil, characterised in that the saturable magnetic core becomes saturated state immediately when voltage is applied to the principal magnetic coil in the same direction as the current in the subsidiary magnetic coil, while becoming the saturated state from an initial unsaturated state at the time when a product of the voltage and time reaches a predetermined value if the voltage is applied to the principal magnetic coil in a direction opposite to the current flowing in the subsidiary magnetic coil.

In the first aspect of the invention, the current fed to the subsidiary coil is set to exactly the level at which the transition from unsaturated to saturated state occurs in the saturable magnetic coil. As a result, if voltage is applied to the principal coil in the direction which causes magnetic flux to be generated in the same direction as that of the magnetic flux which is generated by the electric current flowing in the subsidiary coil, the state of saturation is maintained and the principal coil becomes a state of low inductance, which is to say a conductive state. Meanwhile, if voltage is applied to the principal coil in the direction of cancelling the magnetic flux which is generated by the electric current flowing in the subsidiary coil by the magnetic flux to be generated by the principal coil, a transition from the initial unsaturated state or state of high inductance to a state of saturation or low inductance occurs when the product of voltage and time reaches a prescribed value. With this configuration, the saturable reactor takes a conductive state and has a magnetic switching function according to the direction in which the electric current flows through the principal coil. In other words, it results in the production of a rectifying element wherein the switching function of a saturable reactor is displayed in one direction of flow of electric current through the principal coil, while conductive state is displayed in the other direction.

Because the saturable reactor of the present invention is a high-speed device that is able to withstand high levels of electric power and high voltage in particular, it can be used in the high voltage levels which semiconductor power devices are incapable of withstanding.

The second aspect of the present invention is a power source apparatus for pulse laser comprising a direct-current power supply for charging; a switch element connected in parallel to the direct-current power supply; a magnetic pulse compression circuit comprising a serially connected saturable reactor and capacitor connected in parallel to the switch element; another one or a plurality of serially connected saturable reactor and capacitor successively connected in parallel to the parallelly connected capacitor in proceeding stage so that when the switch element turns on, the energy stored in the capacitors is transferred successively to the capacitor of next stage; and a laser discharge unit connected in parallel to the capacitor in final stage, wherein charging current from the direct-current power supply flows through the saturable reactors, and the saturable reactors comprises a saturable magnetic core; a principal coil wound around the saturable magnetic core; a subsidiary coil wound around the saturable magnetic core; and a power source which feeds electric current to the subsidiary coil when the transition of the saturable magnetic core from unsaturated state to saturated state is effected by the subsidiary coil, wherein the saturable magnetic core becomes saturated state immediately when voltage is applied to the principal magnetic coil in the same direction as the current in the subsidiary magnetic coil, while becoming the saturated state from an initial unsaturated state at the time when a product of the voltage and time reaches a predetermined value if the voltage is applied to the principal magnetic coil in a direction opposite to the current flowing in the subsidiary magnetic coil.

The second aspect of this invention applies the saturable reactor of the first aspect of the invention to the saturable reactor of the first stage in a power source apparatus for pulse laser. Not only does this result in a pulse compression process utilising the saturable reactor, but when electric charge is stored in the capacitor of the first stage by way of the saturable reactor of the first stage, also makes it possible to avoid the occurrence of surge voltage on the side of the saturable reactor nearest to the direct-current power source for charging, thus preventing breakage to the switch element as a result of that surge voltage.

The third aspect of the present invention is a power source apparatus for pulse laser the same as the second aspect of the invention, wherein the saturable reactors other than the saturable reactor of the final stage in the magnetic pulse compression circuit are same as the saturable reactor of the first stage in the magnetic pulse compression circuit.

This configuration displays the same function and effect as the second aspect of the invention.

The fourth aspect of the present invention is a power source apparatus for pulse laser in the second and third aspects of the invention, further comprising a diode which is connected serially to the saturable reactor the final stage of the magnetic pulse compression circuit, conductive direction of the diode being energy transfer direction by the magnetic pulse compression circuit.

With this configuration, it is possible not only to reduce the voltage applied to the laser discharge unit during charging, thus eliminating unnecessary discharge at that stage, but also to return to the capacitor of the preceding stage any energy which remains after being fed to the laser discharge unit, which greatly improves the efficiency of energy consumption at the next pulse oscillation.

DESCRIPTION OF THE PREFERRED EMBODIMENTS

There follows a description of the preferred embodiments of the present invention with reference to the appended drawings.

Figure 1:
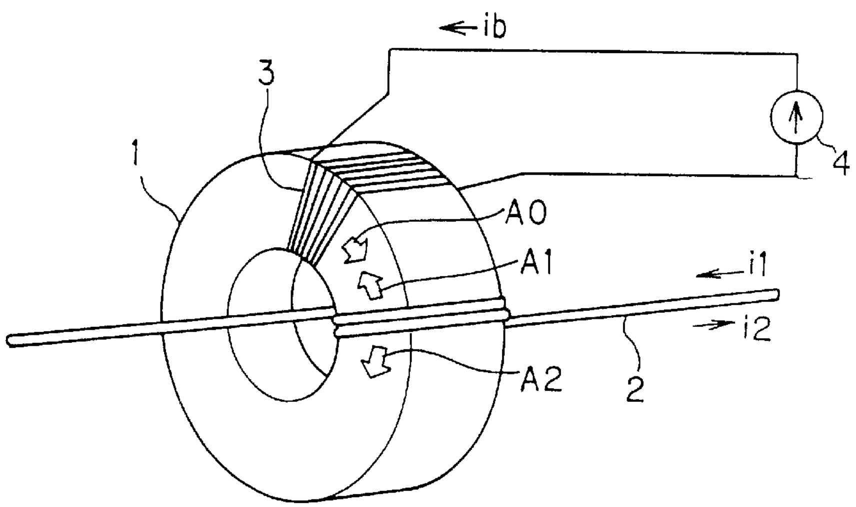
FIG. 1 is a diagram depicting the saturable reactor according to an embodiment of the present invention.

FIG. 1 is a diagram depicting a saturable reactor that forms an embodiment of the present invention. In FIG. 1, a magnetic core 1 comprises a ferromagnetic material such as ferrite, around which a principal coil 2 is wound a predetermined number of times, as also is a subsidiary coil 3. To the subsidiary coil 3 is connected a constant-current source 4 which serves to feed an electric current ib. Thus, when the current source 4 feeds the electric current ib to the subsidiary coil 3, as shown in FIG. 1, a magnetic flux is generated within the magnetic core 1 in the direction A0. Meanwhile, when an electric current i1 is fed to the principal coil 2, a magnetic flux is generated within the magnetic core in the direction A1, and when a current i2 is fed to the principal coil 2, a magnetic flux is generated within the magnetic core 1 in the direction A2. The combination of magnetic fluxes generated within the magnetic core 1 is represented as the magnetic flux density B.

Figure 2:
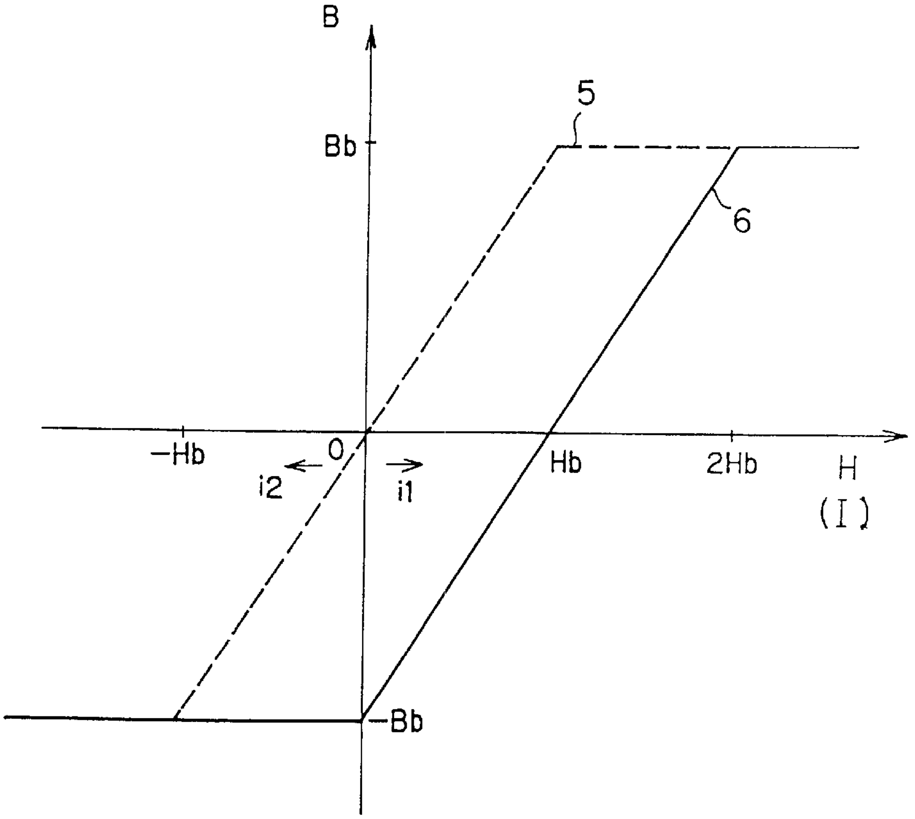
FIG. 2 is a graph illustrating the B–H characteristics of the saturable reactor as depicted in FIG. 1.

FIG. 2 is a graph illustrating the B–H characteristics of the saturable reactor as depicted in FIG. 1. Specifically, the horizontal axis represents the magnetic field H generated in the principal coil 2 as a result of the electric current I, while the vertical axis represents the magnetic flux density B generated within the magnetic core 1. Here, the direction of the electric current i1 is regarded as positive, and the direction of the arrow A1 as the positive direction of the magnetic flux density B.

In FIG. 2, if the subsidiary coil 3 is not provided, the B–H characteristics are determined solely by the electric current I flowing through the principal coil 2, and trace the broken line 5. More specifically, when the electric current I flows in the direction of the current i1, magnetic flux is generated in the direction of the arrow A1. As the current i1 increases, so does the magnetic flux density B, until saturation is attained when the magnetic flux density B reaches the point Bb. Conversely, when the electric current I flows in the direction of the current i2, magnetic flux is generated in the direction of the arrow A2. As the current i2 increases, so does the magnetic flux density B in the negative direction, until saturation is attained when the magnetic flux density B reaches the point –Bb. A state of high inductance exists until saturation is reached, preventing the electric current I from flowing. Once saturation is reached, the magnetic flux density B becomes constant despite an increase in the electrical current I, and this leads to a state of low inductance, permitting the current I to flow.

On the other hand, if the subsidiary coil 3 is provided and the electric current ib is fed from the current source 4, the result is that the magnetic flux having flux density B is already generated in the magnetic core 1. If the level of the electric current ib fed to the subsidiary coil 3 is determined in such a manner that the magnetic core 1 transit from unsaturated state to saturated state, the B–H characteristics trace the solid line 6 as shown in FIG. 2. When the electric current I does not flow to the principal coil 2, all that is generated within the magnetic core 1 is the magnetic flux having flux density B due to the current ib flowing to the subsidiary coil 3. This means that only a slight electric current I flowing in the direction of the current i1 creates an unsaturated state, while even a slight flow in the direction of the current i2 results in saturation. In the case where the subsidiary coil 3 is provided, if the electric current I is flowing in the direction of the current i1, an electric current of twice amount is required for the transition from an unsaturated to a saturated state compared with that the case where the subsidiary coil 3 is not provided.

In the above manner, by providing the subsidiary coil 3 in the magnetic core 1 and feeding the minimum current ib required for the magnetic coil to transit to a saturated state, the B–H characteristics of the magnetic core 1 with respect to the principal coil 2 is shifted. If the electric current flows in the principal coil 2 in the direction of the current i1, a magnetic switch effect takes place same as in the case where the subsidiary coil 3 is not provided. On the other hand, if the electric current flows in the principal coil 2 in the direction of the current i2, the result is constantly of low inductance. In other words, only one side provides the function of a saturable reactor.

Consequently, the saturable reactor illustrated in FIG. 1 has a diode-like function blocking or restricting the flow of the current according to the direction of the current in the principal coil 2. However, for the current flowing in the blocking or restricting direction, this blocking or restriction is lifted when the saturable reactor becomes in the saturated state.

The saturable reactor illustrated in FIG. 1 is not only simple in configuration, but is capable of withstanding large electric power, and large electric current, and especially high voltage. Moreover, since the saturable reactor has a configuration that facilitates high-speed switching, it can apply to the areas that cannot be covered by high-power semiconductor devices.

Figure 3:
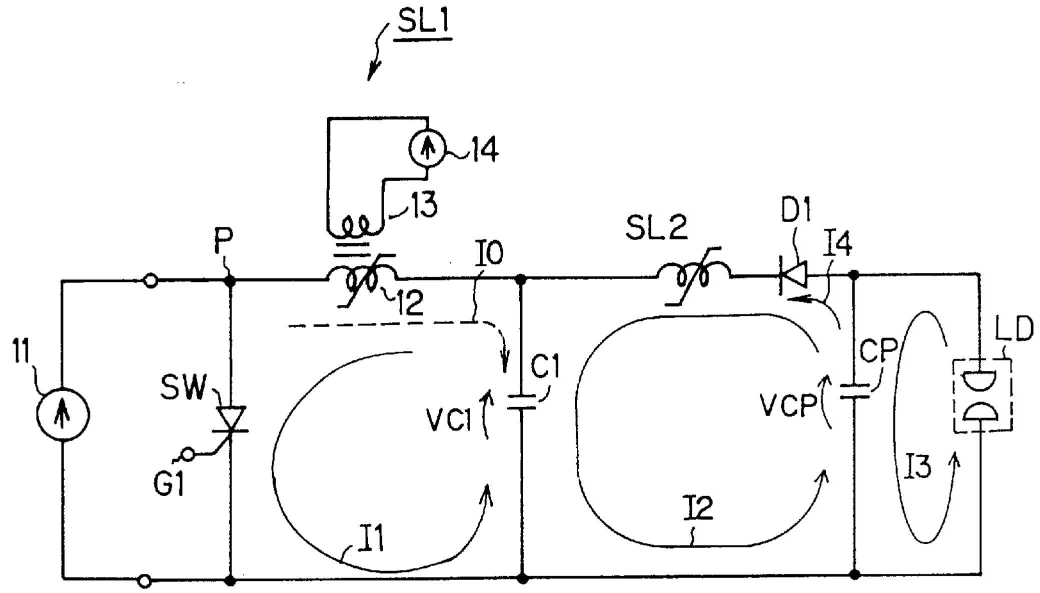
FIG. 3 is a circuit diagram illustrating the configuration of a power source apparatus for pulse laser that utilises the saturable reactor depicted in FIG. 1.
Figure 4:
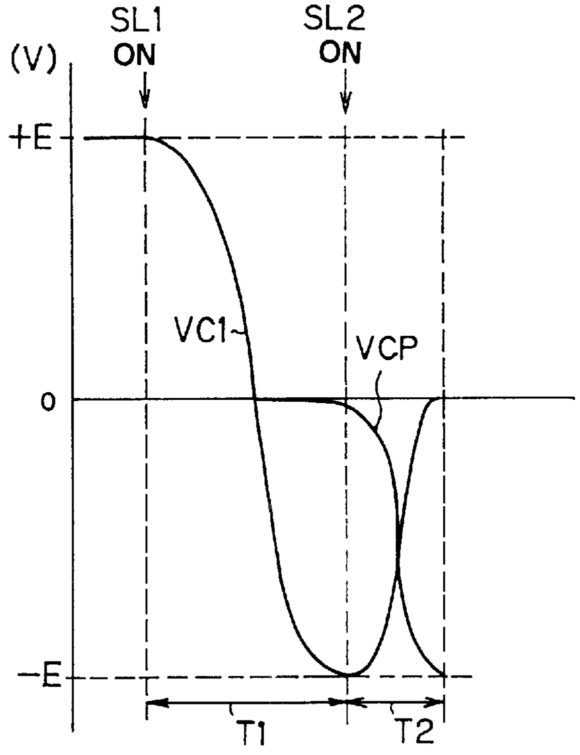
FIG. 4 is a timing chart illustrating voltage changes in the capacitor C1 and peaking capacitor CP of the power source apparatus for pulse laser depicted in FIG. 3.
Figure 5:
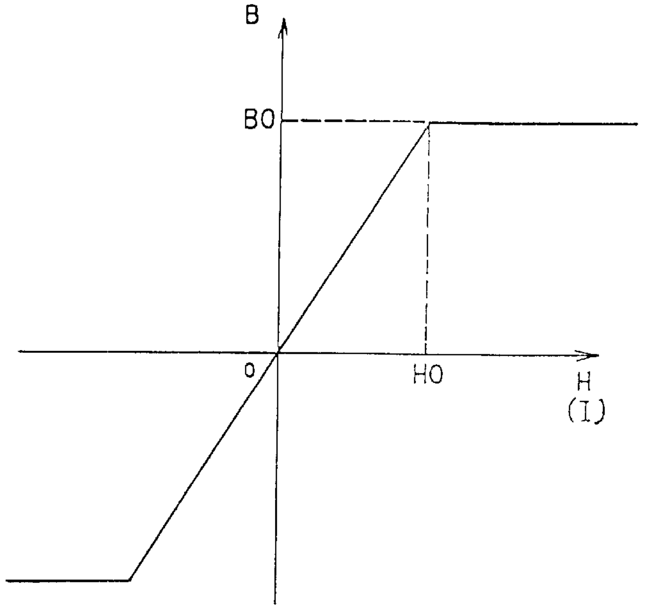
FIG.5 PRIOR ART
FIG. 5 is a graph illustrating the B–H characteristics of a conventional saturable reactor.
Figure 6:
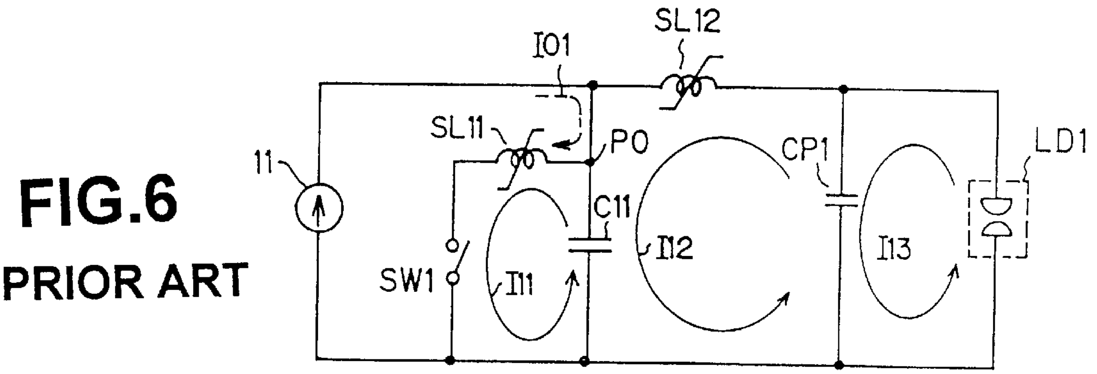
FIG.6 PRIOR ART
FIG. 6 is a circuit diagram illustrating an example of conventional power source apparatus for pulse laser.
Figure 7:
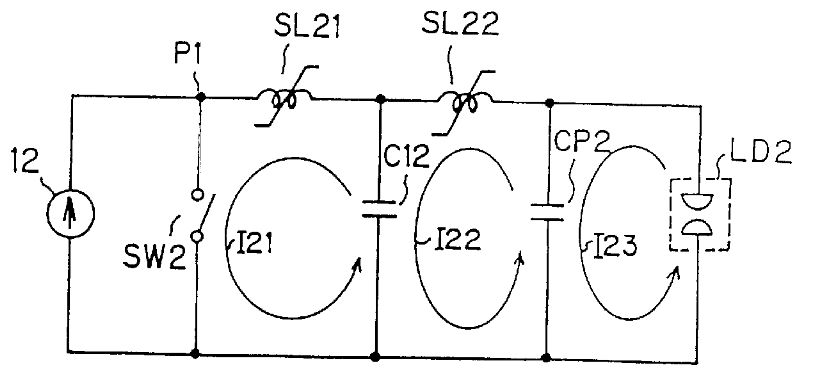
FIG.7 PRIOR ART
FIG. 7 is a circuit diagram illustrating another example of conventional power source apparatuss for pulse laser.

There follows, with reference to FIGS. 3 and 4, a description of a power source apparatus for pulse laser using the saturable reactor illustrated in FIG. 1.

In this power source apparatus for pulse laser as illustrated in FIG. 3, a switch element SW and a serially connected saturable reactor SL1 and capacitor C1 are each connected in parallel to a direct-current power source for charging 11. Meanwhile, a serially connected saturable reactor SL2, diode D1 and peaking capacitor CP are connected in parallel to the capacitor C1, and a laser discharge unit LD is connected in parallel to the peaking capacitor CP. In this case, the conductive direction in the diode D1 is from the peaking capacitor CP towards the saturable reactor SL2. In other words, the conductive direction in the diode D1 is the direction in which energy is transferred during pulse compression transfer. The saturable reactor SL1 used here is the one illustrated in FIG. 1. Particularly, the saturable reactor SL1 is provide with a subsidiary coil 13 in addition to a principal coil 12, and an electric current is fed to the subsidiary coil 13 in advance from a current source 14. As has been described above, the amount of this current is determined such that the magnetic core 1 transits from unsaturated state to saturated state. The saturable reactor SL1 is so arranged that it is in a low inductance state for the direction of flow of the charging current I0 from the direct-current power source for charging 11, and has a magnetic switching function for the direction in which the electric charge stored in the capacitor C1 flows in the form of the current I1.

The capacitor C1 is charged by means of the direct-current high voltage applied by the direct-current power source for charging 11. At this time, the saturable reactor SL1 is in a state of low inductance, so that even supposing there are ripples in the electric current flowing from the direct-current power source for charging 11, no surge voltage is generated at point P on the side of the saturable reactor SL1 closest to the direct-current power source for charging 11. On the other hand, the peaking capacitor CP is not charged. This is because the electric charge is prevented from travelling to the peaking capacitor CP by the diode D1.

Thus, as shown in FIG. 4, on completion of charging, the voltage VC1 across the capacitor C1 is a +E volt while the voltage VCP across the peaking capacitor CP is 0 volt.

If then a prescribed voltage is applied to the gate G1 and the switch element SW turns on, the electric charge stored in the capacitor C1 begins to be transferred. More specifically, when the switch SW turns on, the voltage across the capacitor C1 is applied across the saturable reactor SL1. Thereafter, when a predetermined time has been elapsed, the saturable reactor SL1 becomes saturated. As a result, the saturable reactor SL1 rapidly decreases its inductance, whereby the saturable reactor SL1 turns on. The result, as shown in FIG. 3, is that the electric charge stored in the capacitor C1 flows in the form of the electric current I1, and the polarity of the capacitor C1 reverses. Consequently, as FIG. 4 shows, the voltage across the capacitor C1 changes from +E volts to −E volts. During the interval T1 when this reversal of polarity of the capacitor C1 occurs, the electric charge which was being stored in the peaking capacitor CP leaks by way of the saturable reactor SL1 in spite of the fact that the saturable reactor SL2 is turned off, which causes the voltage drops slightly. However, the level of the leakage is very low because it occurs after the voltage across the capacitor C1 has reached 0 volt.

Thereafter, resulting from the reversal in polarity of the peaking capacitor C1, the voltage VC1 across the capacitor C1 is applied to the saturable reactor SL2 without being blocked by the diode D1. In the elapse of a predetermined time after the voltage VC1 is applied, the saturable reactor SL2 is saturated and turns on. As a result, the electric charge stored in the capacitor C1 flows in the form of the electric current I2, and is transferred to the peaking capacitor CP.

The electric charge transferred to this peaking capacitor CP is applied to the laser discharge unit LD in the form of the electric current I3, the laser medium is excited by a discharge from the laser discharge unit LD, creating laser oscillation. The remaining current other than that which has been expended in the laser discharge unit LD resonates several times between the laser discharge unit LD and the peaking capacitor CP, and, at each resonation, flows back to the capacitor C1 in the form of the electric current I4 by way of the diode D1 and saturable reactor SL2. Moreover, the electric charge that has flown back to the capacitor C1 by way of the diode is prevented from returning to the peaking capacitor CP by the rectifying action of the diode D1. In this manner, not only does the electric charge transferred to the peaking capacitor CP contribute to the discharge of the laser discharge unit LD, but also remaining electric charge can be returned to the capacitor C1 to reduce subsequent charging energy, permitting greatly improve in the efficiency of energy consumption.

It should be added that setting the post-saturation inductance of the saturable reactors SL1, SL2 allows the interval T2 to be shorter than the interval T1 as shown in FIG. 4, and the current level during the transfer of the electric charge becomes large so that energy in the form of pulse is fed to the laser discharge unit LD.

In this manner, by adopting the saturable reactor illustrated in FIG. 1 as the saturable reactor SLY, not only is it possible to smoothly flow the charging current from the direct-current power source for charging 11 so as to store the electric charge in the capacitor C1, but also no surge voltage is generated during charging at the saturable reactor SLY on the side of the direct-current power source for charging 11. This means that there is no risk of breaking the switch element SW, and it is possible to guarantee the withstand voltage of the switch element SW. Moreover, because it functions as a magnetic switch when transferring the electric charge stored in the capacitor C1, the saturable reactor SLY acts as a diode-like unidirectional saturable reactor.

What is claimed is:

1. A saturable reactor consisting essentially of:

a saturable magnetic core;

a principal coil wound around the saturable magnetic core;

a subsidiary coil wound around the saturable magnetic core; and a fixed power source which feeds a constant electric current to the subsidiary coil, the electric current having such an intensity as to cause a magnetic flux in the saturable magnetic core to be saturated in a specified direction in a state where no electric current flows through the principal coil.

2. The power source apparatus for pulse laser according to claim 1, including a variable power source for feeding electric current to the principal coil in a direction opposite that of the constant electric current fed to the secondary coil by the fixed power source, wherein the magnetic flux in the saturable magnetic core created by the fixed power source feeding constant electric current to the secondary coil is sufficient to inhibit flow of electric current through the principle coil in a direction opposite the feeding direction of the variable power source.

3. A power source apparatus for pulse laser comprising:

a direct-current power supply for charging;

a switch element connected in parallel to the direct-current power supply;

a magnetic pulse compression circuit comprising a serially connected saturable reactor and capacitor connected in parallel to the switch element; another one or a plurality of serially connected saturable reactor and capacitor successively connected in parallel to the parallelly connected capacitor in proceeding stage so that when the switch element turns on, the energy stored in the capacitors is transferred successively to the capacitor of next stage; and a laser discharge unit connected in parallel to the capacitor in final stage, wherein charging current from the direct-current power supply flows through the saturable reactors, and the saturable reactors comprises:

a saturable magnetic core;

a principal coil wound around the saturable magnetic core;

a subsidiary coil wound around the saturable magnetic core; and a fixed power source which feeds a constant electric to the subsidiary coil, the electric current having such an intensity as to cause a magnetic flux in the saturable magnetic core to be saturated in a specified direction in a state where no electric current flows through the principal coil.

4. The power source apparatus for pulse laser according to claim 3, wherein each saturable reactor other than the saturable reactor in the final stage of the magnetic pulse compression circuit is the saturable reactor in the first stage of the magnetic pulse compression circuit.

5. The power source apparatus for pulse laser according to claim 3, further comprising a diode which is connected serially to the saturated reactor in a final stage of the magnetic pulse compression circuit, a conductive direction of the diode being an energy transfer direction by the magnetic pulse compression circuit.

6. The power source apparatus for pulse laser according to claim 3, wherein the charging current flows through the principal coil in a direction opposite that of the constant electric current fed to the secondary coil by the fixed power source, and the magnetic flux in the saturable magnetic core created by the fixed power source feeding constant electric current to the secondary coil is sufficient through inhibit flow of electric current to the principle coil in a direction opposite the feeding direction of the variable power source.

7. A saturable reactor consisting essentially of:

a saturable magnetic core;

a principal coil wound around the saturable magnetic core;

a subsidiary coil wound around the saturable magnetic core;

a first power source that feeds electric current to the subsidiary coil when the transition of the saturable magnetic core from unsaturated state to saturated state is effected by the subsidiary coil; and structure including a second power source connecting the saturable magnetic core, the principal and subsidiary coils, and the first power source together so that the saturable magnetic core becomes saturated state immediately when voltage is applied to the principal magnetic coil in the same direction as the current in the subsidiary magnetic coil, while becoming the saturated state from an initial unsaturated state at the time when a product of the voltage and time reaches a predetermined value if the voltage is applied to the principal magnetic coil in a direction opposite to the current flowing in the subsidiary magnetic coil.

8. The power source apparatus for pulse laser according to claim 7, wherein the first power source that feeds the subsidiary coil is a fixed power source which feeds a constant electric to the subsidiary coil.

9. The power source apparatus for pulse laser according to claim 7, wherein the second power source is a variable power source for feeding electric current to the principal coil in a direction opposite that of the constant electric current fed to the secondary coil by fixed power source, and the magnetic flux in the saturable magnetic core created by the fixed power source feeding constant electric current to the secondary coil is sufficient to inhibit flow of electric current through the principle coil in a direction opposite the feeding direction of the variable power source.

10. A power source apparatus for pulse laser comprising:

a direct-current power supply for charging;

a switch element connected in parallel to the direct-current power supply;

a magnetic pulse compression circuit comprising a serially connected saturable reactor and capacitor connected in parallel to the switch element; another one or a plurality of serially connected saturable reactor and capacitor successively connected in parallel to the parallelly connected capacitor in proceeding stage so that when the switch element turns on, the energy stored in the capacitors is transferred successively to the capacitor of next stage; and a laser discharge unit connected in parallel to the capacitor in final stage, wherein charging current from the direct-current power supply flows through the saturable reactors, and the saturable reactors comprises;

a saturable magnetic core;

a principal coil wound around the saturable magnetic core;

a subsidiary coil wound around the saturable magnetic core; and a power source that feeds electric current to the subsidiary coil when the transition of the saturable magnetic core from unsaturated state to saturated state is effected by the subsidiary coil, wherein:

the saturable magnetic core becomes saturated state immediately when voltage is applied to the principal magnetic coil in the same direction as the current in the subsidiary magnetic coil, while becoming the saturated state from an initial unsaturated state at the time when a product of the voltage and time reaches a predetermined value if the voltage is applied to the principal magnetic coil in a direction opposite to the current flowing in the subsidiary magnetic coil.

11. The power source apparatus for pulse laser according to claim 10, wherein each saturable reactor other than the saturable reactor in the final stage of the magnetic pulse compression circuit is the saturable reactor in the first stage of the magnetic pulse compression circuit.

12. The power source apparatus for pulse laser according to claim 10, further comprising a diode which is connected serially to the saturable reactor were in a final stage of the magnetic pulse compression circuit, a conductive direction of a diode being an energy transfer direction by the magnetic pulse compression circuit.

13. The power source apparatus for pulse laser according to claim 10, wherein the power source that feeds the subsidiary coil is a fixed power source which feeds a constant electric to the subsidiary coil.

14. The power source apparatus for pulse laser according to claim 10, wherein the charging current flows through the principal coil in a direction opposite that of the constant electric current fed to the secondary coil by the fixed power source, and the magnetic flux in the saturable magnetic core created by the fixed power source feeding constant electric current to the secondary coil is sufficient to inhibit flow of electric current through the principle coil in a direction opposite the feeding direction of the variable power source.

15. The saturable reactor according to claim 1, wherein the saturable magnetic core is the only saturable magnetic core present in the saturable reactor.

16. The saturable reactor according to claim 7, wherein the saturable magnetic core is the only saturable magnetic core present in the saturable reactor.

* * * * *